(12) United States Patent
Katsap et al.

(10) Patent No.: US 6,528,799 B1
(45) Date of Patent: Mar. 4, 2003

(54) DEVICE AND METHOD FOR SUPPRESSING SPACE CHARGE INDUCED ABERRATIONS IN CHARGED-PARTICLE PROJECTION LITHOGRAPHY SYSTEMS

(75) Inventors: Victor Katsap, Belle Mead, NJ (US); James A. Liddle, Westfield, NJ (US); Masis Mkrtchyan, Gillette, NJ (US); Stuart T. Stanton, Bridgewater, NJ (US)

(73) Assignees: Lucent Technologies, Inc., Murray Hill, NJ (US); eLITH LLC, New Providence, NJ (US)

( * ) Notice: Subject to any disclaimer, the term of this patent is extended or adjusted under 35 U.S.C. 154(b) by 294 days.

(21) Appl. No.: 09/692,150

(22) Filed: Oct. 20, 2000

(51) Int. Cl.[7] .............................................. H01J 37/063
(52) U.S. Cl. ............. 250/398; 250/492.22; 250/492.23; 430/296
(58) Field of Search ............................. 250/398, 492.2, 250/492.21, 492.22, 492.23; 430/296

(56) References Cited

U.S. PATENT DOCUMENTS

| | | | | |
|---|---|---|---|---|
| 3,852,633 | A | * 12/1974 | Hunter | 313/348 |
| 5,258,246 | A | 11/1993 | Berger et al. | 430/296 |
| 5,260,151 | A | 11/1993 | Berger et al. | 430/5 |
| 5,550,432 | A | * 8/1996 | Barker | 315/5 |
| 5,834,786 | A | * 11/1998 | White et al. | 250/398 |
| 5,949,078 | A | * 9/1999 | Ooaeh et al. | 250/398 |
| 6,333,508 | B1 | * 12/2001 | Katsap et al. | 250/492.2 |

OTHER PUBLICATIONS

Jansen, G.H., "Coulomb interactions in particle beams," published in Nuclear Instrumeents and Methods in Physics Research A298 (Apr. 1990) 496–504 North Holland.

Katsap et al, Mesh–equipped Wehnelt source for SCAL-PEL(TM), Proc. of SPIE, Conference on Charged Particle Optics IV, Denver, Colorado, Jul. 1999, SPIE vol. 3777 pp. 75–81.

Mkrtchyan et al, "Stochastic scattering in charged particle projection systems: A nearest neighbor approach," J. Appl. Phys. 78 (12), Dec. 15, 1995, pp. 6888–6902.

Jansen, G.H., "Interactions in particle beams", J. Vac. Sci. Technol. B 6 (6), Nov./Dec. 1988, pp1977–1983.

\* cited by examiner

*Primary Examiner*—Jack Berman
(74) *Attorney, Agent, or Firm*—Pillsbury Winthrop LLP

(57) ABSTRACT

An electron beam lithographic apparatus has an electron gun providing a beam of accelerated electrons, a mask stage adapted to hold a mask in a path of the beam of accelerated electrons, and a workpiece stage adapted to hold a workpiece in a path of electrons that have passed through the mask. The electron gun has a cathode having an electron emission surface, an anode adapted to be connected to a high-voltage power supply to provide an electric field between the cathode and the anode to accelerate electrons emitted from the cathode toward the anode, and a current-density-profile control grid disposed between the anode and the cathode. The current-density-profile control grid is configured to provide an electron gun that produces an electron beam having a non-uniform current density profile. A method of producing a micro-device includes generating a beam of charged particles having a non-uniform charged-particle current density, illuminating a mask with the beam of charged particles, and exposing a workpiece with charged particles from the beam of charged particles.

47 Claims, 7 Drawing Sheets

DEVICE AND METHOD FOR SUPPRESSING SPACE CHARGE INDUCED ABERRATIONS IN CHARGED-PARTICLE PROJECTION LITHOGRAPHY SYSTEMS

BACKGROUND OF THE INVENTION

1. Field of the Invention

This invention relates to an illumination system for an electron beam lithographic apparatus and an electron beam lithographic apparatus having such an illumination system, and more particularly to such apparatuses used for the manufacture of micro-devices, including semiconductor integrated circuits.

2. Discussion of Related Art

Electron beam exposure apparatuses have been used for lithography in semiconductor processing for more than two decades. The first e-beam exposure devices were based on the flying spot concept of a highly focused beam, raster scanned over the object plane. In this approach, the electron beam is modulated as it scans so that the beam itself generates the lithographic pattern. These devices have been widely used for high precision tasks, such as lithographic mask making, but the raster scan mode is too slow to achieve the high throughput required in semiconductor wafer processing. The electron source in this type of device is similar to that used in electron microscopes, i.e., a high brightness source focused to a small spot beam.

More recently, a new electron beam exposure apparatus has been developed based on the SCALPEL (Scattering with Angular Limitation Projection Electron-beam Lithography) technique. In this approach, a wide-area electron beam is projected through a lithographic mask onto the object plane. Since relatively large areas of a semiconductor wafer can be exposed at a time, throughput is increased. The high resolution of this device makes it attractive for ultra-fine line lithography, i.e., sub-micron.

The requirements for the electron beam source in SCALPEL exposure devices differ significantly from those of a conventional focused beam exposure device, or a conventional transmission electron microscope (TEM) or scanning electron microscope (SEM). While high resolution imaging is still a primary goal, this must be achieved at relatively high (10–100 $\mu$A) gun currents in order to realize improved wafer throughput. Relatively low axial brightness is required, e.g., $10^2$ to $10^4$ $Acm^{-2}sr^{-1}$, as compared with a value of $10^6$ to $10^9$ $Acm^{-2}sr^{-1}$ for a typical focused beam source. However, the beam flux over the larger area must be highly uniform to obtain the required lithographic dose latitude and CD control.

The development of SCALPEL apparatuses has been directed to the development of an electron source that provides uniform electron flux over a relatively large area, that has relatively low brightness, and high emittance. (Emittance is defined as D×$\alpha$ and is typically expressed in units of micron×milliradian, where D is beam diameter, and $\alpha$ is divergence angle.) Conventional, state-of-the-art electron beam sources generate beams having an emittance in the 0.1–400 micron×milliradian range, while SCALPEL-like devices require emittance in the 1000 to 5000 micron×milliradian range. Conventional SCALPEL illumination system designs have been either Gaussian gun-based or grid-controlled gun-based. A common drawback of both types is that beam emittance depends on actual Wehnelt bias, which couples beam current control with inevitable emittance changes. From a system viewpoint, independent control of the beam current and beam emittance is beneficial.

Furthermore, particle projection system throughput is dependent on the resolution due to the Coulomb interactions between the charged particles. Coulomb interactions induce beam blur that increases with increasing beam current, thus limiting the system performance for a given resolution.

One can distinguish three separate effects based on Coulomb interactions. The first is a global, or average effect, also called the global space charge (SC) effect. The global SC effect induces only image defocus and magnification change if the current density distribution is uniform in every cross-section of the beam along the projection column. In this case SC acts like an ideal negative lens and its effect can be corrected simply by changing the lens focal length or the image plane position relative to the Gaussian plane. The second effect is also a global SC effect, but one that creates image aberrations if the beam current density profile is not uniform, in addition to the above-noted defocus and magnification.

The third effect is a stochastic space charge effect resulting from the random nature of the mutual Coulomb interaction force between particles in a flux consisting of discrete charged particles. Stochastic interactions generate beam blur either directly by inducing trajectory deflections of a particle moving along the column, or indirectly through lens chromatic aberrations by generating particle energy spread, that is, the so-called Boersch effect.

Unlike the deterministic global space charge effects, neither trajectory displacement nor the Boersch effect can be corrected, because they are stochastic. They can only be controlled by careful design.

There is currently a need for devices and techniques to control the global space charge induced aberrations which are dominant in high throughput projection systems (the second above-noted effect). Global SC induced aberrations can, in principle, be corrected or avoided if the system design provides a laminar flux of the charged particles with a uniform current density profile in any cross-section of the beam along the column. In beams with low and medium currents used in lithography and metrology, laminar flux (i.e., particle trajectories that do not cross each other) cannot be realized. This has the implication that a uniform illumination intensity or current density achieved, for instance, in several critical planes such as the mask and wafer planes, will not necessarily stay such in any cross-section of the column. Accordingly, in the areas of the column where the current density becomes nonuniform, the space charge effect will induce beam blur.

The global space charge effects are, in general, well characterized by the beam perveance, $P=I/V^{3/2}$, a function of the beam current, I, and the beam voltage, V. While the space charge induced defocus, which is completely correctable, might also be proportional to the column length, L, the blur induced by the space charge lensing action, is defined by both the degree of the beam current nonuniformity and the effective length of only the portion of the column, $L_{eff}$, where the current density is not uniform.

In particle projection systems, Koehler illumination is utilized to achieve a uniformly illuminated sub-field in the mask plane. Koehler illumination optics project a bundle of rays coming out from any single point of the cathode or the virtual source into the entire sub-field in the mask plane. In projection devices with fixed size and shape of the sub-field, the sub-field is formed using one or two perpendicular rectangular shaping apertures installed in the planes optically conjugate with the mask or wafer plane in variable shape systems.

In current electron projection systems, the electron gun has a relatively large size uniform-emission, low-brightness cathode, and appropriately designed electrodes, and provides spatially uniform intensity of the energetic (typically 100 keV) electrons leaving the source uniformly in a given angular range (about NA/4 after the shaping aperture to match with the limiting aperture angular size, where NA is the numerical aperture). Note that in probe forming systems, sources with a high-brightness $LaB_6$ cathode and electrodes that form a narrow crossover of about tens of micrometers with essentially nonuniform Gaussian current density are used. The smaller the NA, and the lower the degree of the beam current density nonuniformity, the smaller the global SC induced blur, as opposed to the stochastic blur increasing with decreasing NA. This is why in the early designs of particle projection systems with small NA, and, therefore, low throughput, the major concerns were the stochastic blurring and the lens aberrations. However, the current invention is directed to high throughput electron projection lithography systems that use higher NA optics to provide increased throughput. Global space-charge-induced aberrations in higher NA systems are more severe problems than beam blur generated by Coulomb stochastic interactions.

SUMMARY OF THE INVENTION

Accordingly, this invention is directed to devices and methods for controlling and/or suppressing space-charge-induced aberrations. One aspect of this invention is directed to an electron gun for an electron beam lithographic apparatus that has a cathode having an electron emission surface, an anode adapted to be connected to a accelerating-voltage power supply to provide an electric field between the cathode and the anode to accelerate electrons emitted from the cathode toward the anode, and a current-density-profile control grid (also referred to as the "grid" and "control grid" hereinafter) disposed between the anode and the cathode. The current-density-profile control grid is configured to provide an electron gun that produces an electron beam having a non-uniform current density profile.

Another aspect of this invention is directed to an electron beam lithographic apparatus that has the above-noted electron gun.

Still another aspect of this invention is directed to a method of producing a semiconductor device by generating a beam of charged particles that has a non-uniform current density profile, illuminating a mask with the beam of charged particles, and exposing a workpiece with charged particles from the beam of charged particles.

Yet another aspect of this invention is directed to microdevices made by the above-noted methods.

BRIEF DESCRIPTION OF THE DRAWINGS

These and other objects and advantages of the invention will become more apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

Figure 1:
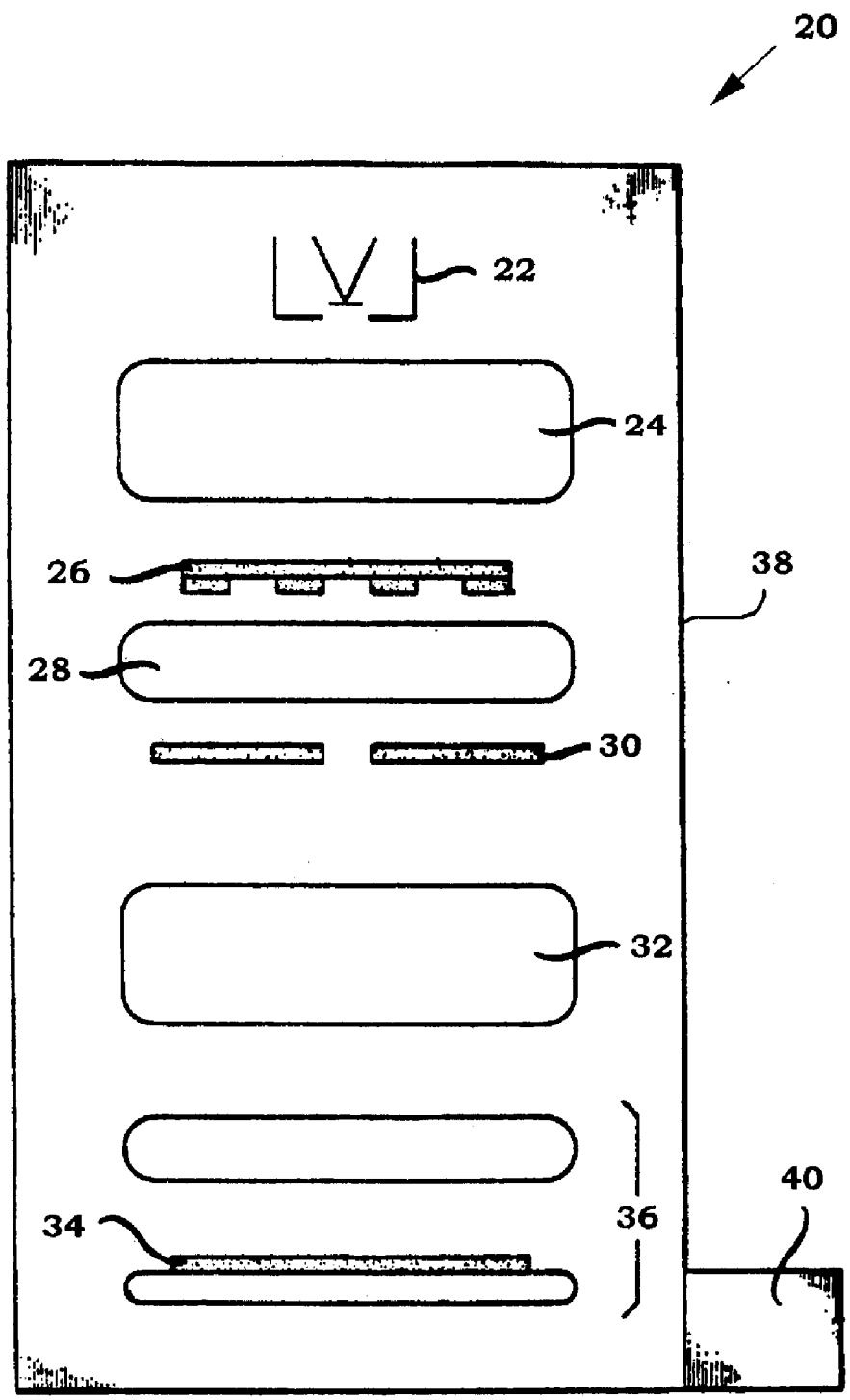
FIG. 1 is schematic illustration of an electron beam lithographic apparatus having an electron gun according to the current invention.

FIG. 1 is a schematic illustration of an electron beam lithographic apparatus 20 fabricated according to an exemplary embodiment of this invention. The electron beam lithographic apparatus 20 has an electron gun 22, an illumination lens system 24, a mask 26 mounted on a mask holder, an objective lens system 28, a back focal plane filter 30, a projection lens system 32, an exposure medium 34 mounted on a substrate holder, and an alignment system 36, in that order along the electron beam path. The exposure medium 34 is also referred to as a "workpiece" in this specification. A chamber 38 is maintained at a vacuum by a vacuum pump 40. The reader may find additional details of conventional SCALPEL methods and devices in U.S. Pat. Nos. 5,079,112 and 5,258,246, both to Berger et al. The entire contents of both are hereby incorporated by reference.

The exemplary embodiments make specific reference to an electron beam. However, a beam of charged particles experiences Coulomb interactions regardless of whether the particles of the beam are electrons, protons, atomic ions, other such charged particles, or a mixture of various types of charged particles. The scope and spirit of this invention is intended to include charged-particle apparatuses and methods which include electron beams as an exemplary type of charged particle.

Figure 2:
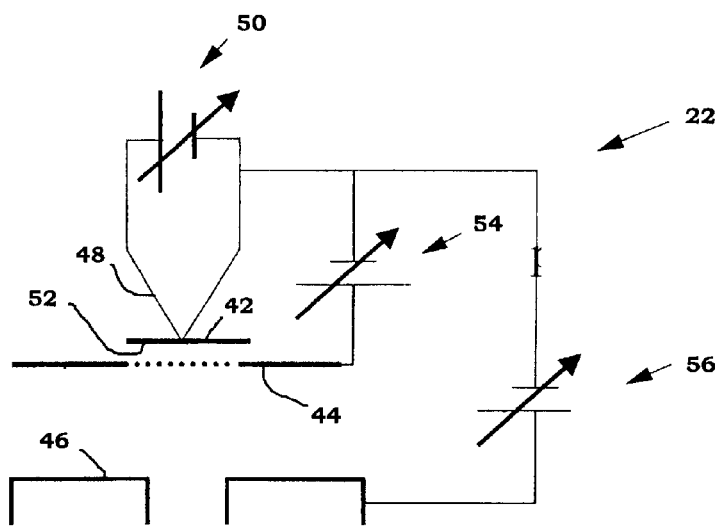
FIG. 2 is a schematic illustration of the general structural features of an electron gun according to the current invention.

FIG. 2 is a schematic illustration of the electron gun 22 showing additional details. The electron gun 22 generally has a cathode 42, a current-density-profile control grid 44 and an anode 46. The cathode 42 is in thermal contact with a heating filament 48 which is connected to a filament power supply 50. Tungsten wire has been found to be a suitable material for the heating filament 48. The cathode 42 has an electron emission surface 52. Preferably, the electron emission surface 52 is a disk with a diameter in the range of 0.05 to 3.00 mm. Tantalum has been found to be a suitable material for the electron emission surface 52, but the invention is not limited to the use of only tantalum electron emitters. A grid power supply 54 is electrically connected to the control grid 44 and the cathode 42. An accelerating-voltage power supply 56 is electrically connected to the anode 46 and the cathode 42 to provide an electric field between the cathode 42 and anode 46 to accelerate electrons emitted from the electron emission surface 52 of the cathode 42. In this arrangement, the potential of the current-shaping grid 44 is determined by the grid power supply 54, and is not a function of the emission current, as is the case with a conventional Wehnelt setup.

In operation of the electron gun 22, the heating filament 48 heats the cathode 42 and causes electrons within the cathode 42 to attain an increased kinetic energy. The combined electric field produced by the accelerating-voltage power supply 56 and grid power supply 54 at the electron emission surface 52 enables sufficiently energetic electrons to escape from the cathode 42 through the electron emission surface 52. Varying the strength and/or polarity of the grid power supply 54 causes the electric field at the electron emission surface 52 to vary, thus varying the rate at which the electrons escape from the material of the cathode 42. Once electrons have been extracted from the cathode 42, they are accelerated towards the anode 46. A beam of electrons passes through an aperture defined by the anode 46 to exit the electron gun 22 as a beam of electrons. For most effective exposures, the beam brightness is preferably limited to a value less than $10^5$ $Acm^{-2}Sr^{-1}$. This is in contrast to conventional scanning electron beam exposure devices which are typically as bright as possible. (See, e.g., U.S. Pat. No. 4,588,928 issued May 13, 1986 to Liu et al, the entire contents of which are hereby incorporated by reference.) The kinetic energy of electrons ex iting the electron gun are typically about 100 keV in currently contemplated applications; however, this invention is not limited to a specific electron beam energy.

Figure 3:
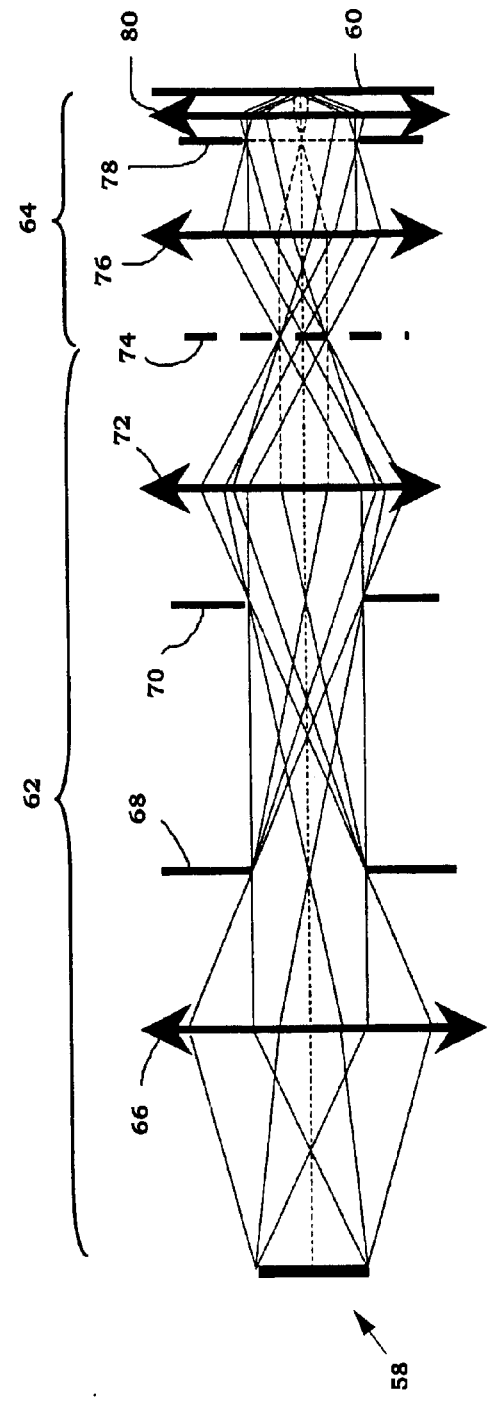
FIG. 3 is a ray-trace diagram illustrating an optical analogy for an electron beam lithographic system according to the current invention.

FIG. 3 illustrates a ray-trace diagram corresponding to a portion 21 of the electron beam lithographic apparatus 20 along the section from the output of the electron gun 58 to the wafer 60, i.e., the workpiece including an exposure medium. The portion 21 of the electron beam lithographic apparatus 20 generally includes illumination system 62 and a projection system 64. Each of the illumination system 62 and projection system 64 typically includes a plurality of components such as electrostatic and/or magnetic lenses and various apertures. In the embodiment illustrated in FIG. 3, the illumination system 62 has a first converging lens 66, a shaping aperture 68, a blanking aperture 70 and a second converging lens 72. Electrons emitted from the gun output 58 are converged by lenses 66 and 72 to illuminate mask 74. Electrons that pass through the mask 74 are converged by lens 76, some of which pass through aperture 78 to be converged by lens 80 onto the wafer 60.

Figure 4:
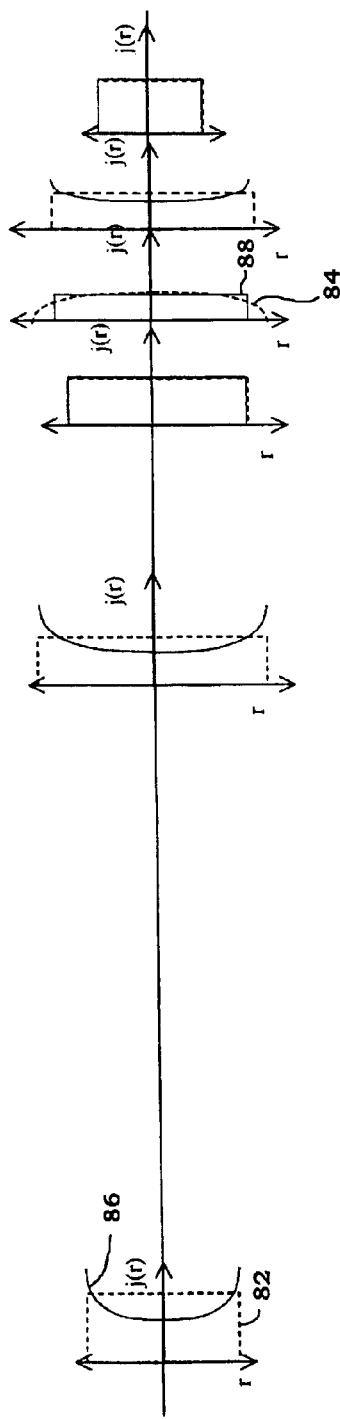
FIG. 4 is a schematic illustration illustrating electron beam current densities at several slices across the electron beam corresponding to FIG. 3.

FIG. 4 is a schematic illustration representing electron current density profiles of the electron beam illustrated in FIG. 3 at several instantaneous transverse slices through the electron beam. Under a conventional SCALPEL illumination, a nearly uniform current density distribution is output from the electron gun output 58, as illustrated by the dashed line labelled reference numeral 82 in FIG. 4. The initially uniform current density 82 output from the electron gun takes on a non-uniform distribution 84 when it reaches the lens 76 (compare, FIGS. 3 and 4). One aspect of the instant invention is to generate an electron beam at the output of the electron gun such that the beam has an electron current density profile 86 which has a non-uniform electron current density. In another aspect of the invention, the electron gun produces an electron current density profile 86 which has a smaller electron current density in the center of the profile than on the edges of the profile. At the lens 76, shown in FIG. 3, the electron beam current density profile 88 (FIG. 4) according to the current invention has a substantially uniform distribution radially across the beam in the transverse direction. The initial electron current distribution, which is depressed in the center and enhanced along the edges, thus compensates for space charge effects (i.e., reduced space-charge-induced aberrations) according to an aspect of this invention. In other embodiments of this invention, the initial electron current density distribution at the output from the electron gun substantially fully compensates for space charge effects as the electron beam travels from the electron gun to the workpiece.

Figure 5:
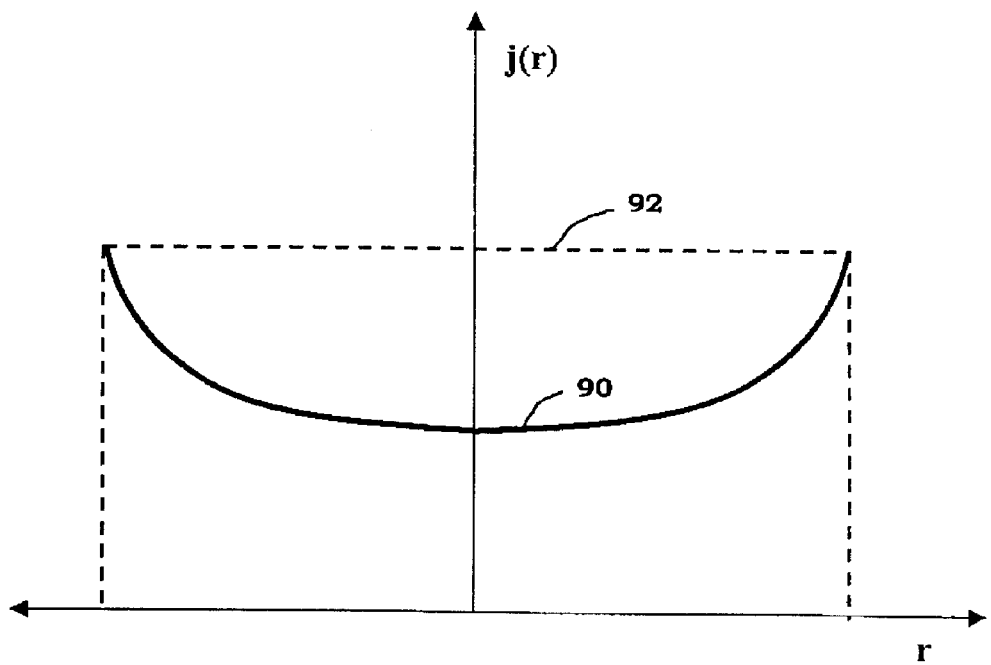
FIG. 5 illustrates desirable electron beam current density profiles output from an electron gun according to the current invention.

FIG. 5 illustrates beam current density profiles in a transverse direction across an electron beam at the output of the electron gun 22 according to the current invention. An electron gun according to an embodiment of the current invention produces an electron beam having a current density profile with a decreased current density at a center of the beam and an increased current density at an edge of the beam at the output of the electron gun, as illustrated by the current density profile 90 in FIG. 5. In an embodiment of the invention, the current density profile 90 has a concave shape as shown in FIG. 5. Such a current density profile at the output of the electron gun reduces beam blur induced by Coulomb interactions, as noted above. The electron gun can also selectively produce an output electron beam with a substantially uniform electron current density, if desired. An example of such a uniform electron current density is illustrated in FIG. 5 by the dashed line at reference numeral 92. The electron gun can be operated to change, in real time, between a substantially uniform electron current density 92 and a concave electron current density 90 in an embodiment of the invention. The above-noted features may be achieved in at least four exemplary approaches, or by combinations of the four exemplary approaches, in constructing embodiments of the invention.

Figure 6A:
FIGS. 6A–6D are schematic illustrations for explaining general structural features of the electron gun according to the current invention.

Under the first exemplary approach, the control grid illustrated schematically by reference numeral 44 in FIG. 2 may be shaped such that it has a non-flat surface, as illustrated schematically in FIG. 6A. In the embodiment of FIG. 6A, a grid portion 94 of the current-density-profile control grid 96 has a non-flat shape such that portions of the grid portion 94 are closer to the cathode 98 than other portions of the grid portion 94. Preferably, the grid portion 94 of the control grid 96 has a convex surface on a side that is closest to the cathode 98. In this case, a grid power supply is attached between the control grid 96 and the cathode 98 such that the grid portion 94 of the control grid 96 has a negative potential with respect to the cathode 98. Since central portions of the grid portion 94 of the control grid 96 are closer to the cathode 98 than outer portions of the grid portion 94 of the control grid 96, fewer electrons are emitted from the central region of the cathode 98 than from outer regions due to the negative potential of the grid portion 94 of the control grid 96. The grid portion 94 of the control grid 96 has a convex shape in one embodiment of the invention. However, the scope of the invention includes varying electron emission across the cathode 98 by a current-density-profile control grid that has at least one portion closer to the cathode 98 than other portions of the control grid. Alternatively, the grid portion 94 of the control grid 96 has a concave surface proximate the cathode 98, and an applied positive voltage results in electron emission being encouraged more strongly along the edges of the cathode 98 than at the center of the cathode 98. This similarly leads to an electron beam current density that has a greater value along an outer edge of the electron beam than at a portion close to the center of the electron beam.

Figure 6B:
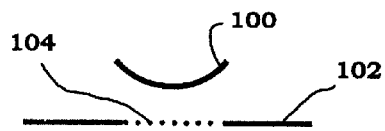

A second exemplary approach is to form a cathode 100 which has a curved shape while the current-density-profile control grid 102 has a grid portion 104 which is substantially flat, as is illustrated schematically in FIG. 6B. To obtain a non-uniform current density profile output from the electron gun, a negative grid potential is applied between the cathode 100 and the grid portion 104 of the control grid 102. The portions at the center of the cathode 100 are closer to the grid portion 104 than edge portions of the cathode 100 resulting in impeding the emission of electrons at the center portion more than at edge portions than would be obtained without a voltage applied to the grid portions 104 of the current-density-profile control grid 106. Similarly, one can see from the description herein that the scope of this invention is not limited to the particular shape of the cathode illustrated in FIG. 6B. In an embodiment of the invention, the cathode 100 has a convex surface closest to the grid portion 104 of the control grid 102.

Figure 6C:
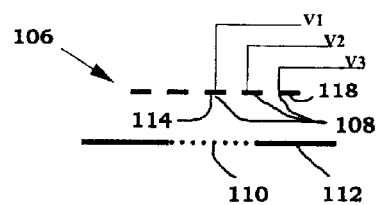

FIG. 6C illustrates a third exemplary approach according to the invention. In this approach, the cathode 106 has a plurality of portions, three of which are labeled 108 in FIG. 6C, which can each have an individually selectable voltage applied relative to the grid portion 110 of the current-density-profile control grid 112. Preferably, the separate portions 108 of the cathode 106 are substantially electrically isolated from each other. The voltages applied to each of the individual portions 108 of the cathode 106 may be equal to or different from other portions of the cathode 106. The voltage $v_1$ is selected such that the electric field at the surface 114 has a smaller magnitude than the field at the surface 118, in a direction to accelerate electrons toward the control grid 112, in order to obtain a current density profile in which a current density around the central portion of the electron beam output from the electron gun is smaller than the electron current density at an edge portion of the electron beam. FIG. 6C illustrates an exemplary approach schematically and should not be construed as limiting the construction of the cathode 106 and control grid 112 to the specific structure shown. The plurality of portions 108 may vary in number and shape according to the specific application.

Figure 6D:
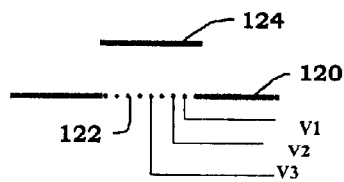

FIG. 6D illustrates a fourth exemplary approach according to the current invention. Under this approach, the grid portion 122 of the current-density-profile control grid 120 has a plurality of individually selectable potentials applied to separate portions of the grid portion 122 of the control grid 120. The separate portions of the grid portion 122 of the control grid 120 are substantially electrically isolated from each other. Under this approach, a more negative potential applied at $v_3$ than at $v_1$, for example, leads to a current density profile which has a reduced current density towards the center of the electron beam emanating from the electron gun than at edge portions of the electron beam. FIG. 6D is a schematic illustration intended to illustrate exemplary approaches, and is not to be construed as requiring a specific structure for the grid portion 122 of the control grid 120. The specific structure of a grid portion 122 of the control grid 120 may be selected according to the particular application.

The four exemplary embodiments illustrated schematically in FIGS. 6A–6D may also be combined in all possible permutations. For example, one may combine features from FIGS. 6A and 6B to include both a shaped cathode and a shaped control grid. Another example may be to include a shaped cathode which has a plurality of portions which can be set at selectable potential differences as well as a shaped control grid. Another example may include a shaped grid portion of a control grid that has a plurality of portions which may be set at selectable electric potentials. Similarly, other combinations of the above-noted exemplary approaches are included within the scope of this invention.

Figure 7A:
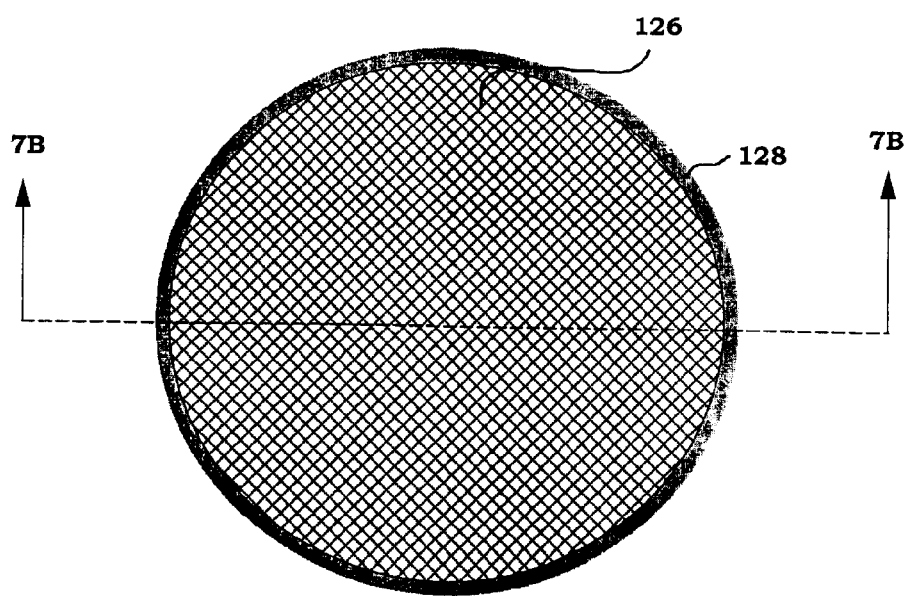
FIGS. 7A and 7B illustrate a top view, and a cross-sectional view, respectively, of a current-density-profile control grid according to a preferred embodiment of the current invention.
Figure 7B:
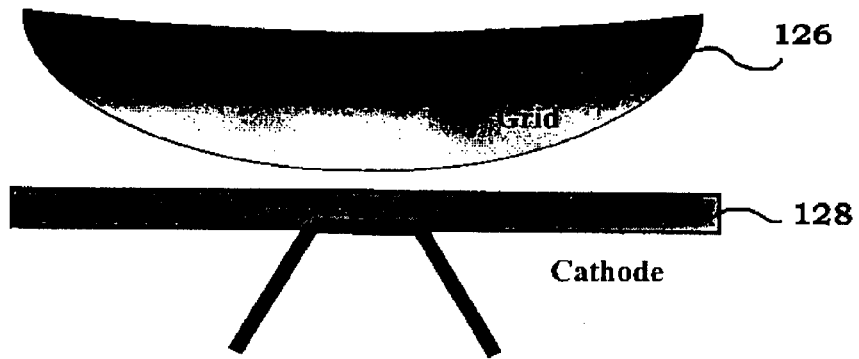

FIGS. 7A and 7B illustrate an embodiment of a current-density-profile control grid 126 and cathode 128 for an electron gun according to this invention. FIG. 7A is a top view illustrating the mesh configuration of the control grid 126. FIG. 7B is a cross-sectional view corresponding to FIG. 7A illustrating the convex shape of a control grid 126 along a surface closest to the cathode 128. Electrons which are extracted from the cathode 128 that pass through the mesh of the control grid 126 continue on to form the electron beam. A negative potential is applied to the control grid 126 so that the current density profile of the electron beam output from the electron gun has a concave profile similar to that illustrated in FIG. 5.

Figure 8:
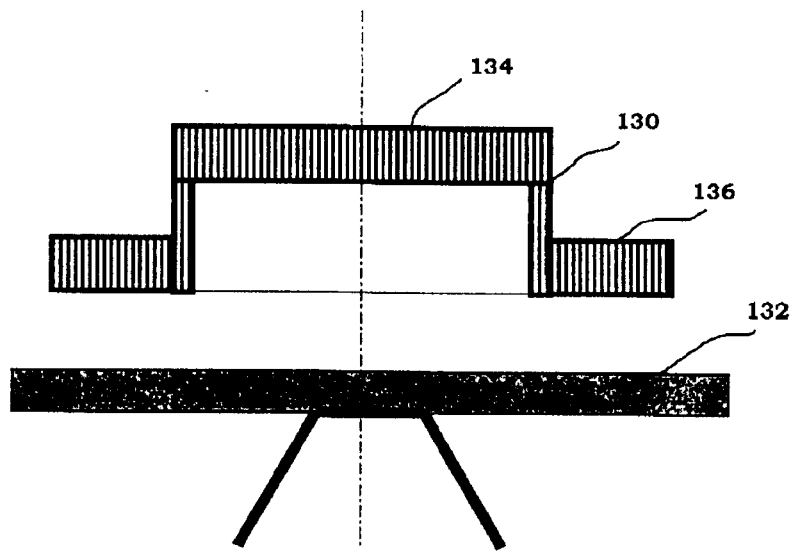
FIG. 8 is a cross-sectional view of a second preferred embodiment of a current-density-profile control grid according to the current invention.

FIG. 8 illustrates another embodiment of a current-density-profile control grid 130 and cathode 132 according to the invention. The control grid 130 has a flat region 134 which is displaced in an axial direction towards an exit portion of the electron gun relative to a second flat portion 136. A positive electric potential is applied to the control grid 130 relative to the cathode 132, leading to enhancing the emission of electrons proximate the flat portion 136 of the control grid 130 compared to the flat portion 134 of the control grid 130. This hat-shaped control grid 130 may be thought of as one example of a control grid with a concave surface closest to the cathode 132.

Figure 9:
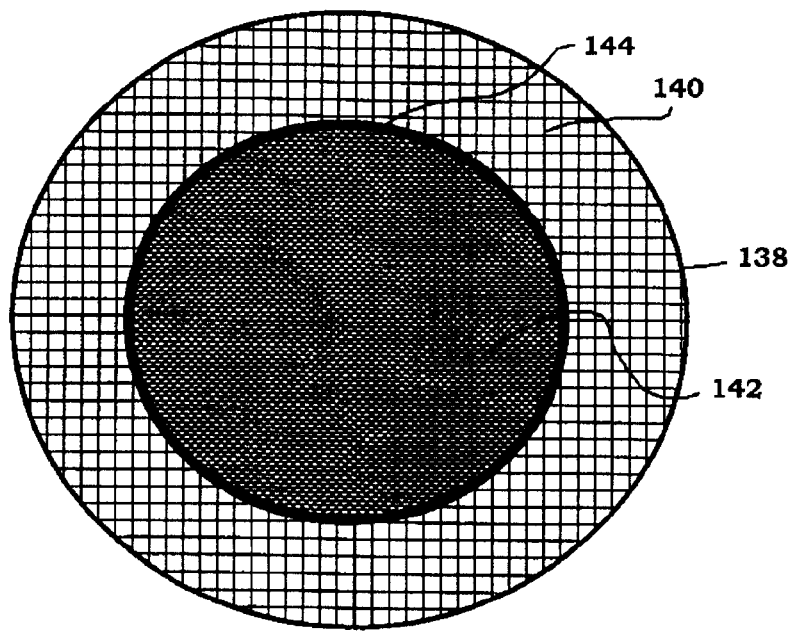
FIG. 9 is a top view of a current-density-profile control grid according to a third preferred embodiment of this invention.

FIG. 9 illustrates another embodiment of a current-density-profile control grid 138. The control grid 138 has a first grid portion 140 and a second grid portion 142 which are preferably electrically isolated from each other by an insulator 144 therebetween. The grid portion 140 and the grid portion 142 are each adapted to be connected to individually selectable electric potentials. The electric potentials of the regions 140 and 142 may be selected to be equal, or different. Furthermore, the control grid 138 may be flat, or curved. In the case of a flat control grid 138, one may apply a more negative voltage to the grid portion 142 than to the grid portion 140 to obtain an electron beam at the output of the electron gun that has a smaller electron current density at a center portion of the beam than at an edge portion of the beam.

Figure 10:
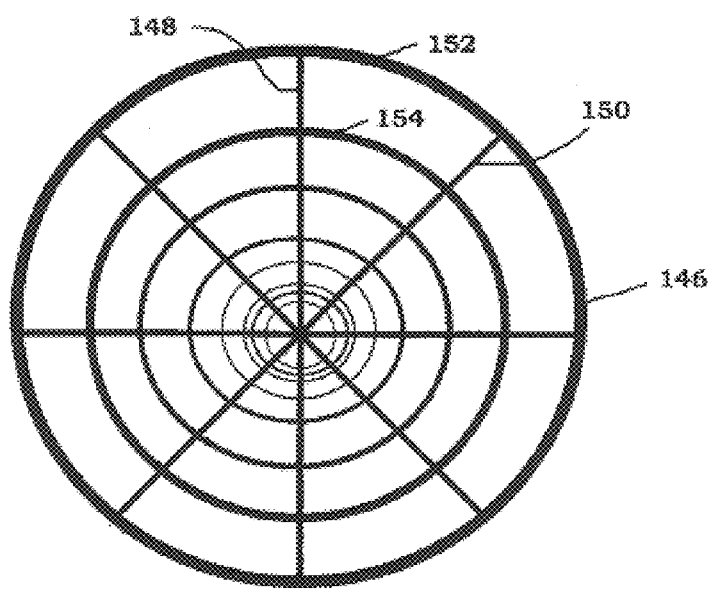
FIG. 10 is a top view of a current-density-profile control grid according to a fourth preferred embodiment of the current invention.

FIG. 10 illustrates another embodiment of a current-density-profile control grid 146 according to this invention. The concentric circular lines and radial lines in FIG. 10 are structural components which define open spaces therebetween. All structural components of the control grid 146 may be selected from conductive materials in an embodiment in which the entire structural components of the control grid 146 are to be held at the same electric potential. Alternatively, one may select some of the structural components to be electrically conductive and some to be insulating materials in order to provide a plurality of electric potentials to the control grid 146. For example, selecting insulating materials for structural components 148 and 150 and conductive materials for components 152 and 154 permits one to apply either the same or different electric potentials to the components 152 and 154. One can see that there are many variations and possibilities within the general concept of this embodiment. Furthermore, the control grid 146 may be flat, or may be curved.

Figure 11:
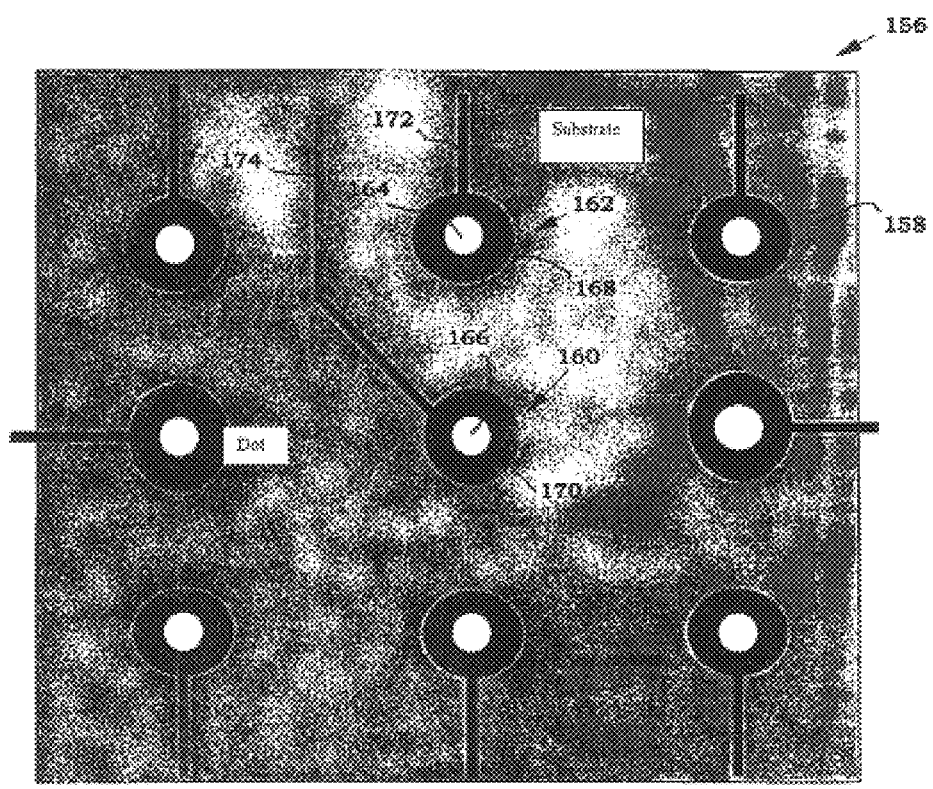
FIG. 11 is a top view of a portion of a current-density-profile control grid according to a fifth embodiment of the current invention.

FIG. 11 illustrates another example of a portion of a current-density-profile control grid 156 structured according to another embodiment of the invention. In this embodiment, the control grid 156 has a substrate 158 which is made from a material with a high electrical resistivity. A plurality of conductive "dots" are constructed and arranged in the substrate 158 of the control grid 156. Two of the plurality of conductive dots are labeled with reference numerals 160 and 162, respectively. Holes such as 164 and 166 are etched through the substrate 158 and conductive material is deposited in regions 168 and 170 around the holes 164 and 166. In the example illustrated in FIG. 11, all conductive dots are substantially the same size and shape. However, this invention includes cases in which one selects the size and/or shape of the dots according to the intended application. An advantage of an array of substantially equal-sized dots is simplicity in manufacture. The conductive regions 168 and 170 of dots 162 and 160 are in electrical contact with conductive pathways 172 and 174, respectively. The conductive pathways 172 and 174 may continue, along the surface of the substrate 158, the entire way to the edge of the control grid 156. The array of conductive dots on the substrate 158 of the control grid 156 thus permits one to set each dot to a selectable electrical potential which may be equal to or different from the electric potentials of the remaining dots of the control grid 156. Furthermore, the electric potentials applied to the control grids in all above-noted embodiments may be varied in time to produce a time-varying current density distribution for the electron beam output from the electron gun.

The grid portions of the above-noted current-density-profile control grids are made from electrically conducting material. The precise material is otherwise relatively non-critical. Tantalum, tungsten, molybdenum, titanium, or even steel have been found to be suitable materials for the grid portion of the current-density-profile control grids. It is contemplated that other conductive materials and/or alloys are also suitable materials for the grid-portions of the control grids. Transparencies of the grid portions of the control grids in the range of 40–90% have been found to be suitable, where the transparency is defined as the two-dimensional void space divided by the overall grid-portion area.

In operation, the filament heating power supply 50 drives an electric current through the heater filament 48 which generates heat from resistive heating to heat the cathode 42 that is in thermal contact with the heater filament 48 (see, FIG. 2). The acceleration-voltage power supply 56, electrically connected to the anode 46 and the cathode 42, provides an electric field between the cathode 42 and the anode 46. A voltage applied across the control grid 44 and the cathode 42 provides an electric field component which either adds to or subtracts from the electric field provided by the acceleration-voltage power supply 56. Varying the strength and polarity of the voltage applied across the control grid 44 and the cathode 42 permit one to enhance or inhibit the number of electrons emanating from the electron emission surface 52. The control grid 44 is selected from one of the control grids 126, 130, 138, 146 or 156 illustrated in FIGS. 7A–11 in the above exemplary embodiments. The control grid, in combination with the cathode and acceleration-voltage power supply, extracts electrons to form an electron beam that has a current density similar to the current density 90 illustrated in FIG. 5 at the output of the electron gun 22. An electron current density 90 or an electron current density 92 can be selected according to the applied voltage to the control grid 126, 130, 138, 146 or 156.

The electron beam is then output from the electron gun 22 and directed towards the illumination system 24 (see, FIG. 1). The electron beam emerging from the illumination lens system 24 illuminates the mask 26. Thicker and more dense regions of the mask 26 scatter the electrons passing therethrough more strongly than other regions of the mask. One may find additional features of suitable mask structures described in U.S. Pat. Nos. 5,079,112, and 5,258,246, the entire contents of which are incorporated by reference above. The electrons scattered most strongly are stopped by the aperture 30 which permits predominantly weakly scattered electrons to pass therethrough. This yields a positive mask image according to the SCALPEL approach. Conversely, the aperture 30 may be replaced by an aperture having an annular opening to block the central portion and permit the strongly scattered electrons to pass therethrough. This approach produces a negative image in the SCALPEL approach. The electrons are then imaged onto the workpiece 34 to produce a device by electron beam lithography. The electron gun 22 leads to an improved image of the mask 26 on the workpiece 34 by reducing beam blur due to space charge effects resulting from Coulomb interactions between the electrons in the electron beam. The electron beam lithographic apparatus 20 according to the current invention thus leads to the manufacture of improved devices.

This invention is also directed to a method of producing semiconductor devices in which a beam of charged-particles is generated such that the beam has a non-uniform charged-particle current density profile. In an embodiment of the invention, the beam of charged particles has a charged-particle current density at a central portion of the charged-particle beam that is less than a charged-particle current density along an outer region of the charged-particle beam. The charged-particle beam then illuminates a mask that has a pattern of varying density and/or thicknesses such that denser and/or thicker regions of the mask scatter the charged particles more strongly than other regions of the mask. The charged particles are then projected onto a workpiece in which the projection system includes a back focal plane filter to perform spatial filtering on the charged particles. In other words, a central aperture is provided to obtain a positive image on the workpiece, or an annular aperture is provided to obtain a negative image on the workpiece. The workpiece exposed may be a semi-conductor wafer for an integrated circuit, for example. However, the invention is not limited to only integrated circuits and/or semiconductor devices. This invention also includes devices manufactured according to the methods of this invention, including semiconductor devices such as integrated circuits.

Although the invention was described in detail with reference to exemplary embodiments, those skilled in the art will readily appreciate that many modifications are possible to the exemplary embodiments without materially departing from the novel teachings and advantages of this invention. All such modifications are intended to be included within the scope of this invention as defined in the following claims.

We claim:

1. An electron beam illumination system, comprising:

an electron gun providing a beam of electrons;

a mask stage adapted to receive a mask and disposed in a path of said beam of electrons; and a workpiece stage adapted to receive a workpiece and disposed in a path of electrons that have passed through said mask, wherein said electron gun comprises:

a cathode having an electron emission surface, an anode disposed proximate said cathode, said anode and cathode being adapted to be connected to an acceleration-voltage power supply to provide an electric field between said cathode and said anode to accelerate electrons emitted from said cathode toward said anode, and a current-density-profile control grid disposed between said anode and said cathode and adapted to be connected to a control grid power supply, said current-density-profile control grid adapted to act in cooperation with said cathode and said anode to produce an electron beam having a non-uniform current density profile.

2. An electron beam illumination system according to claim 1, wherein said electron beam has a first current density proximate a center of said electron beam that is less than a second current density proximate an edge of said electron beam.

3. An electron beam illumination system according to claim 1, wherein said current-density-profile control grid has a contoured surface.

4. An electron beam illumination system according to claim 3, further comprising a grid power supply electrically connected to said current-density-profile control grid and said cathode.

5. An electron beam illumination system according to claim 1, wherein said cathode has a contoured surface.

6. An electron beam illumination system according to claim 4, wherein said grid power supply provides a negative electric potential to said current-density-profile control grid, and wherein said current-density-profile control grid has a convex surface on a side closest to said electron emission surface of said cathode.

7. An electron beam illumination system according to claim 6, wherein said electron emission surface of said cathode is substantially flat.

8. An electron beam illumination system according to claim 4, wherein said grid power supply provides a positive electric potential to said current-density-profile control grid, and wherein said current-density-profile control grid has a concave surface on a side closest to said electron emission surface of said cathode.

9. An electron beam illumination system according to claim 8, wherein said electron emission surface of said cathode is substantially flat.

10. An electron beam illumination system according to claim 1, wherein said current-density-profile control grid has a first surface region that is substantially flat and a second surface region that is substantially flat, said second surface region being displaced in an axial direction of said electron gun with respect to said first surface region.

11. An electron beam illumination system according to claim 1, wherein said current-density-profile control grid has a first surface region that is adapted to be electrically connected at a first electric potential and a second surface region that is adapted to be electrically connected at a second electric potential, said first and second surface regions of said current-density-profile control grid being electrically isolated from each other.

12. An electron beam illumination system according to claim 11, wherein said current-density-profile control grid is substantially flat.

13. An electron beam illumination system according to claim 12, wherein said electron emission surface of said cathode is substantially flat.

14. An electron beam illumination system according to claim 1, wherein said current-density-profile control grid has a plurality of electrically conductive surface regions, each electrically conductive surface region of said plurality of electrically conductive surface regions being adapted to be electrically connected at a respective independently selectable electric potential and each of said plurality of electrically conductive surface regions of said current-density-profile control grid being substantially electrically isolated from the others.

15. An electron beam illumination system according to claim 1, wherein said cathode has a plurality of electron emission surface regions, each said electron emission surface region being adapted to be electrically connected at a respective independently selectable electric potential and each of said plurality of electron emission surface regions of said cathode being substantially electrically isolated from the others.

16. An electron beam illumination system according to claim 4, further comprising an acceleration-voltage power supply electrically connected to said anode and said cathode, and adapted to provide said electric field between said cathode and said anode to accelerate said electrons emitted from said cathode toward said anode.

17. An electron beam illumination system according to claim 1, further comprising a projection system arranged in said path of electrons between said mask stage and said workpiece, wherein said projection system is constructed and arranged to project an electron image of said mask onto said workpiece.

18. An electron beam illumination system according to claim 17, wherein said electron image is a reduced electron image of said mask on said workpiece.

19. An electron gun for an electron beam illumination system, comprising:

a cathode having an electron emission surface;

an anode disposed proximate said cathode, said anode and cathode adapted to be connected to an acceleration-voltage power supply to provide an electric field between said cathode and said anode to accelerate electrons emitted from said cathode toward said anode; and a current-density-profile control grid disposed between said anode and said cathode and adapted to be connected to a control grid power supply, said current-density-profile control grid adapted to act in cooperation with said cathode and said anode to produce an electron beam having a non-uniform current density profile.

20. An electron gun for an electron beam illumination system according to claim 19, wherein said electron beam has a first current density proximate a center of said electron beam that is less than a second current density proximate an edge of said electron beam.

21. An electron gun for an electron beam illumination system according to claim 20, wherein said current-density-profile control grid has a contoured surface.

22. An electron gun for an electron beam illumination system according to claim 21, further comprising a grid power supply electrically connected to said current-density-profile control grid and said cathode.

23. An electron gun for an electron beam illumination system according to claim 20, wherein said cathode has a contoured surface.

24. An electron gun for an electron beam illumination system according to claim 22, wherein said grid power supply provides a negative electric potential to said current-density-profile control grid, and wherein said current-density-profile control grid has a convex surface on a side proximate said electron emission surface of said cathode.

25. An electron gun for an electron beam illumination system according to claim 24, wherein said electron emission surface of said cathode is substantially flat.

26. An electron gun for an electron beam illumination system according to claim 22, wherein said grid power supply provides a positive electric potential to said current-density-profile control grid, and wherein said current-density-profile control grid has a concave surface on a side closest to said electron emission surface of said cathode.

27. An electron gun for an electron beam illumination system according to claim 26, wherein said electron emission surface of said cathode is substantially flat.

28. An electron gun for an electron beam illumination system according to claim 20, wherein said current-density-profile control grid has a first surface region that is substantially flat and a second surface region that is substantially flat, said second surface region being displaced in an axial direction of said electron gun with respect to said first surface region.

29. An electron gun for an electron beam illumination system according to claim 20, wherein said current-density-profile control grid has a first surface region that is adapted to be electrically connected at a first electric potential and a second surface region that is adapted to be electrically connected at a second electric potential, said first and second surface regions of said current-density-profile control grid being electrically isolated from each other.

30. An electron gun for an electron beam illumination system according to claim 29, wherein said current-density-profile control grid is substantially flat.

31. An electron gun for an electron beam illumination system according to claim 30, wherein said electron emission surface of said cathode is substantially flat.

32. An electron gun for an electron beam illumination system according to claim 20, wherein said current-density-profile control grid has a plurality of electrically conductive surface regions, said regions being adapted to be electrically connected at a respective independently selectable electric potential and each of said plurality of electrically conductive surface regions of said current-density-profile control grid being substantially electrically isolated from the others.

33. An electron gun for an electron beam illumination system according to claim 20, wherein said cathode has a plurality of electron emission surface regions, each of which is adapted to be electrically connected at a respective independently selectable electric potential and each of said plurality of electron emission surface regions of said cathode being substantially electrically isolated from the others.

34. A charged-particle beam illumination system, comprising:

a source of charged particles;

a pair of electrodes adapted to be connected to an acceleration-voltage power source, said pair of electrodes being constructed and arranged to receive charged particles therebetween from said source of charged particles; and a current-density-profile control grid disposed between said pair of electrodes, said current-density-profile control grid constructed and arranged to act in cooperation with said pair of electrodes to produce a charged-particle beam having a non-uniform current density profile.

35. An electron beam illumination system, comprising:

an electron gun providing a beam of electrons;

a mask stage adapted to receive a mask and disposed in a path of said beam of electrons; and a workpiece stage adapted to receive a workpiece and disposed in a path of electrons that have passed through said mask, wherein said electron gun comprises:

a cathode having an electron emission surface, an anode disposed proximate said cathode, said anode being adapted to be connected to an acceleration-voltage power supply capable of generating an electric field between said cathode and said anode to accelerate electrons emitted from said cathode toward said anode, and beam-density-profile control means for controlling the production of an electron beam having a non-uniform electron current density profile prior to reaching said mask stage.

36. A method of producing a micro-device, comprising:

generating a beam of charged particles having a smaller charged-particle current density at a central region of said beam than along an outer region of said beam;

illuminating a mask with said beam of charged particles, said mask having a pattern defined by regions which scatter charged particles more strongly than other regions of said mask; and exposing a workpiece with charged particles from said beam of charged particles.

37. A method of producing a micro-device according to claim 36, wherein said device is produced to have features having a dimension less than 100 nm.

38. A method of producing a micro-device according to claim 36, wherein said workpiece is a semiconductor workpiece.

39. A method of producing a micro-device according to claim 36, further comprising projecting an electron-image of said mask onto said workpiece.

40. A method of producing a micro-device according to claim 39, wherein said projecting an electron-image of said mask includes projecting a reduced image.

41. A method of producing a micro-device, comprising:

generating a beam of charged particles having a non-uniform charged-particle current density;

illuminating a mask with said beam of charged particles, said mask having a pattern defined by regions which scatter charged particles more strongly than other regions of said mask; and exposing a workpiece with charged particles from said beam of charged particles, wherein said non-uniform charged-particle current density becomes substantially uniform during said illuminating said mask.

42. A micro-device manufactured according to the method of claim 36.

43. A micro-device manufactured according to the method of claim 37.

44. A micro-device manufactured according to the method of claim 38.

45. A micro-device manufactured according to the method of claim 39.

46. A micro-device manufactured according to the method of claim 41.

47. An integrated circuit manufactured according to the method of claim 38.

\* \* \* \* \*